US006549019B2

(12) United States Patent
Nielsen

(10) Patent No.: US 6,549,019 B2
(45) Date of Patent: Apr. 15, 2003

(54) TESTING DEVICE FOR EVALUATING THE IMMUNITY OF AN ELECTRONIC DEVICE TO ELECTROMAGNETIC NOISE

(75) Inventor: Arnold David Nielsen, Northville, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 65 days.

(21) Appl. No.: 09/735,230

(22) Filed: Dec. 11, 2000

(65) Prior Publication Data

US 2002/0070732 A1 Jun. 13, 2002

(51) Int. Cl.[7] .................. G01R 27/28; G01R 29/26; H04B 17/00
(52) U.S. Cl. .................. 324/628; 324/603; 324/613; 455/67.1
(58) Field of Search .................. 324/628, 603, 324/602, 620, 613, 420, 415; 338/78; 455/1, 67.1, 67.4; 327/384

(56) References Cited

U.S. PATENT DOCUMENTS

| | | | | |
|---|---|---|---|---|
| 3,131,248 A | * | 4/1964 | Sigel | 342/360 |
| 3,657,555 A | | 4/1972 | Hoffman | 307/108 |
| 3,774,208 A | * | 11/1973 | Dorn et al. | 331/78 |
| 3,940,632 A | * | 2/1976 | Padgug | 307/112 |
| 4,023,098 A | * | 5/1977 | Roth | 324/603 |
| 4,417,207 A | * | 11/1983 | Sato | 307/108 |
| 4,464,791 A | * | 8/1984 | Eness | 331/78 |
| 6,242,925 B1 | * | 6/2001 | Schutten et al. | 324/529 |
| 6,262,871 B1 | * | 7/2001 | Nemir et al. | 324/424 |
| 6,396,286 B1 | * | 5/2002 | Chu et al. | 324/536 |

OTHER PUBLICATIONS

Report of the SAE EMI Standards Committee, Electrical Interference by Conduction and Coupling–Coupling Clamp –SAE J1113/12 (Dec., 1994), pp. 62–65.
Kimball Williams, Institute of Electrical and Electronics Engineers Publication, Microprocessor Software for EMI Recovery (Jul., 1987), pp. 297–301.

* cited by examiner

*Primary Examiner*—N. Le
*Assistant Examiner*—Anjan K. Deb
(74) *Attorney, Agent, or Firm*—Brinks Hofer Gilson & Lione

(57) ABSTRACT

A testing device generates electromagnetic noise such as transients, power interruptions and Radio Frequency Interference (RFI) for application to an electronic device to test the immunity of the electronic device to electromagnetic noise or to test the performance of the electronic device during exposure to electromagnetic noise. The testing device promotes an economical and efficient evaluation of Electromagnetic Compatibility (EMC) of an electronic device during product design or otherwise. The testing device includes a switch having electrical contacts for producing electromagnetic noise during a transition between a closed state and an open state of the electrical contacts and a trigger that is coupled to the switch. The trigger is arranged to change states between the closed state and the open state of the electrical contact. An input terminal is associated with the switch for applying electrical energy to the switch. An output terminal is associated with the switch for connection to the electronic device for testing operation of the electronic device in response to the electromagnetic noise.

33 Claims, 4 Drawing Sheets

TESTING DEVICE FOR EVALUATING THE IMMUNITY OF AN ELECTRONIC DEVICE TO ELECTROMAGNETIC NOISE

FIELD OF THE INVENTION

This invention relates to a testing device for evaluating the immunity of an electronic device to electromagnetic noise, such as electrical transients, power interruptions and Radio Frequency Interference (RFI).

BACKGROUND OF THE INVENTION

Electronic devices may be susceptible to a wide variety of electromagnetic noise. Electromagnetic noise includes electrical transients, power interruptions and RFI that may be radiated or conducted by man-made equipment such as electrical equipment or machinery. For example, electromagnetic noise may be created if a machine has an electric motor that is turned on via an electromechanical switch. The electric motor has windings, which form an inductive load. The inductive load may cause electrical transients or power interruptions on power transmission lines that are coupled to an electronic device. In the case of an automobile electrical system, a windshield wiper motor or an electric fuel pump can induce electrical transients into the electrical system which may interfere with other more sensitive electronic devices, such as a radio or a compact disc player.

Electronic devices, such as radios or microprocessor-based equipment, may be susceptible to RFI from cellular phones, citizen band radios, and other transmitting equipment. For example, an engine control module may be exposed to radiation from a land mobile transmitter installed on the vehicle, which may result in reduced performance due to interference with the engine control module.

Electronics manufacturers may use tests with expensive test equipment to identify potential susceptibility or a lack of immunity of an electronic device to electromagnetic noise. For example, an automotive electronics manufacturer may use a standardized test, consistent with International Standards Organization (ISO) 7637 or another applicable standard, to test electronic equipment for immunity to electrical or electromagnetic noise. Standard tests may require a high level of technical skill and expertise in electrical and electronic testing. In addition, standard tests involve the expense of purchasing and maintaining the equipment that may be required to conduct the test according to the specified guidelines or requirements.

Even if an electronic device complies with a standardized test of immunity to electromagnetic interference, the actual performance of the electronic device in the field may be deficient in the presence of electromagnetic interference. If immunity problems are not identified sufficiently early in the design of the electronic device, then the quality and performance of the electronic device may suffer. Further, the expense of any remedial or corrective action of the design of the electronic device may be substantially increased as a design matures or is introduced into actual production.

Commercially available test equipment may be used to generate repeatable electromagnetic noise with a precise amplitude and spectral response. However, arranging the commercial test equipment to scan over a wide spectrum with different amplitudes may be necessary to identify deficient performance of certain microprocessor-based equipment. Many commercially available transient noise generators require an inordinate amount of testing time to align or match the characteristics of the electromagnetic noise to the susceptible portion of executable software of microprocessor-based equipment.

Thus, a need exists for an inexpensive, easy-to-use testing device and procedure that can effectively identify or screen potential realistic field concerns associated with electronic equipment. Further, a need exists for a testing device that facilitates the optimization of the design of the electronic equipment.

SUMMARY OF THE INVENTION

In accordance with the invention, a testing device generates electromagnetic noise for application to an electronic device to easily evaluate the immunity of the electronic device to electromagnetic noise or to test the performance of the electronic device during exposure to electromagnetic noise. The testing device includes a switch having electrical contacts for producing electromagnetic noise during a transition between a closed state and an open state of the electrical contacts. A trigger is coupled to the switch. The trigger is arranged to change states of the switch between the closed state and the open state of the electrical contacts. An input terminal is associated with the switch for applying electrical energy to the switch. An output terminal is associated with the switch for connection to an input terminal of the electronic device for testing operation of the electronic device in response to the electromagnetic noise.

In accordance with one aspect of the invention, the testing device may include a resistive arrangement (e.g., a potentiometer) for adjusting the level of electromagnetic noise applied to the tested device. For example, the resistive arrangement may permit the level of electromagnetic noise applied to the test device to be adjusted to mimic real world conditions present in a vehicular or automotive environment. The testing device of the invention is well suited for use by non-experts and does not require elaborate training or expertise for reliable test results.

In accordance with another aspect of the invention, the testing device may include a resistive network coupled to the output terminal of the switch. The resistive network allows coupling of electromagnetic noise to the electronic device. Various combinations of the resistive network, the trigger, and input electrical energy allow different magnitudes or other characteristics of electromagnetic noise to be generated.

DETAILED DESCRIPTION OF THE INVENTION

Figure 1:
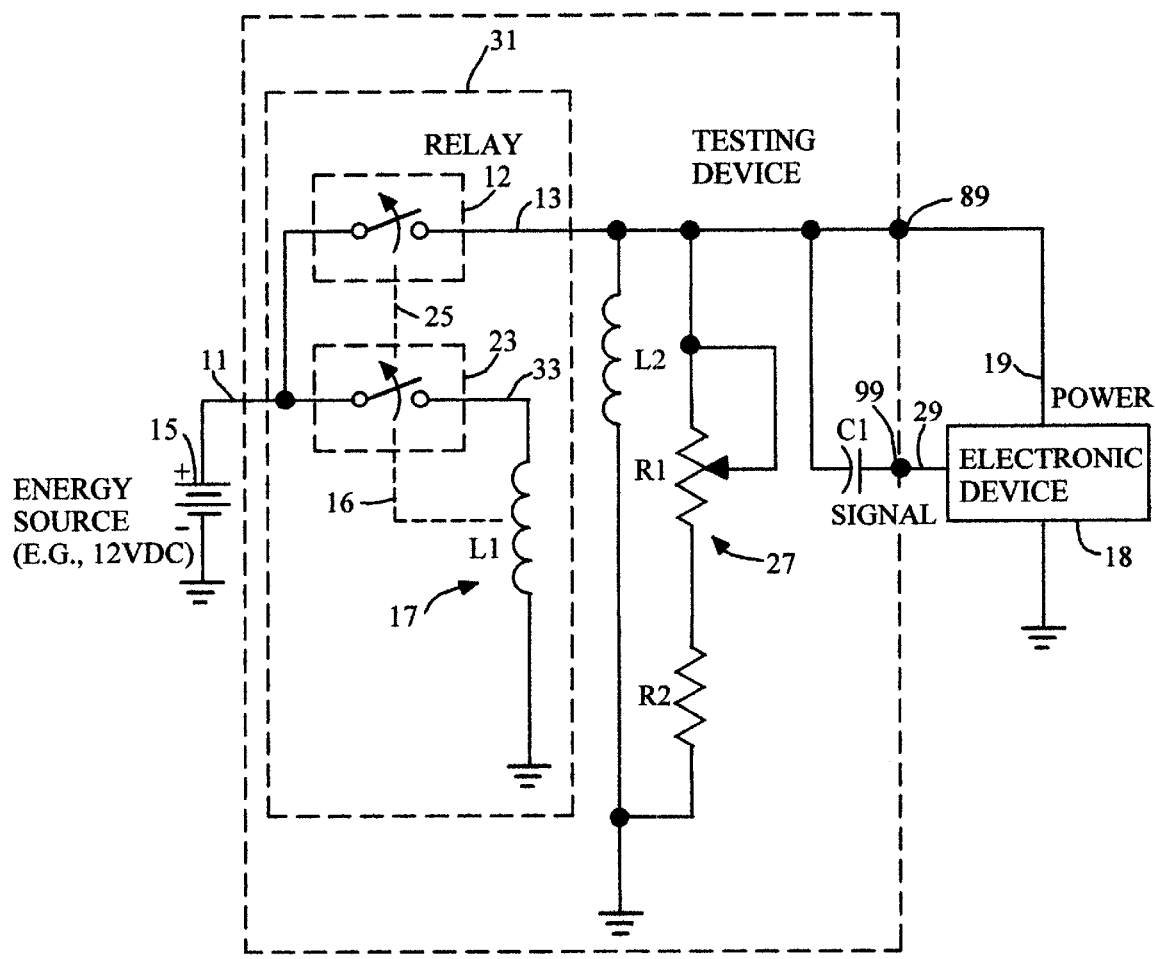
FIG. 1 is a schematic diagram of one embodiment of a testing device for testing a response or performance of an electronic device to the application of electromagnetic transient noise in accordance with the invention.

In accordance with the invention, FIG. 1 shows an energy source 15 coupled to a testing device 10. In turn, the testing device 10 is coupled or connected to an electronic device 18 under test. Although FIG. 1 shows the relationship between the testing device 10, the energy source 15, and the electronic device 18 to illustrate the operation of the testing device 10, the testing device 10 may be made or sold alone in accordance with the invention.

The testing device 10 includes a relay 31 for generating electromagnetic noise (e.g., transient noise). The relay 31 has an input terminal 11 to receive the application of electrical energy from the energy source 15. The relay 31 has a first output terminal 13 coupled to one end of an inductor L2. An opposite end of the inductor L2 is shunted to ground. A resistive adjustment 27 may be coupled in parallel with the inductor L2 to control the magnitude of the electromagnetic transient noise induced in the inductor L2. The resistive adjustment 27 may include a series combination of a potentiometer R1 and a resistor R2, for example. The testing device 10 provides one or more test outputs (89, 99) for outputting the electrical noise.

In one embodiment, the relay 31 includes a first switch 12, a second switch 23, an interconnecting member 25, and a trigger 17. The input terminals of the first switch 12 and the second switch 23 may be electrically connected to form the input terminal 11. The first switch 12 may be mechanically coupled to the second switch 23 via the interconnecting member 25 such that a state of the first switch 12 tracks a state of the second switch 23.

The trigger 17 is affiliated with the second switch 23 and controls the operational state of at least the second switch 23. The trigger 17 includes a solenoidal coil L1 that is associated with a movable mechanical member 16. The solenoidal coil L1 produces a magnetic field for inducing movement of the movable mechanical member 16. The movement of the mechanical member or a component of the second switch 23 may bring about a corresponding movement of the first switch 12 via the interconnecting member 25.

The energy source 15 may comprise a battery, a direct current voltage supply, an alternating current supply in combination with a rectifier, or another source of electrical energy. The relay 31 may comprise a direct current relay, although other configurations are possible and fall within the scope of the invention. In one embodiment, the relay 31 represents a normally closed relay.

Although the invention may be applied to virtually any voltage level, the testing device 10 is well suited for testing an electronic device 18 that ordinarily operates within a range from approximately 12 volts direct current (VDC) to approximately 50 VDC. For example, in the embodiment of FIG. 1, the relay 31 may refer to a 12 VDC relay and the energy source 15 may refer to a 12 VDC energy source to be compatible with the input power requirements (e.g., 12 VDC, negative ground) of the electronic device 18.

The relay 31 may be configured to have the input terminal 11 apply electrical energy to the first switch 12 and the second switch 23. The first switch 12 has electrical contacts for producing electromagnetic noise during a transition between a closed state and an open state of the electrical contacts. "Between a closed state and an open state" means from a closed state to an open state, or vice versa. The first output terminal 13 is associated with the first switch 12 for connection to a power input terminal 19 or a signal terminal 29 of the electronic device 18 for testing operation of the electronic device 18 in response to the electromagnetic noise.

The second switch 23 is used to control the closed state and the open state of the electrical contacts of the first switch 12 in an electrically isolated manner from loading of the electronic device 18 under test. A second output terminal 33 of the relay 31 is associated with the second switch 23. The second output terminal 33 is connected to the solenoidal coil L1.

The solenoidal coil L1 is an inductor that provides a magnetic field in response to the application of electrical energy from the energy source 15. The movable member 16 may include a magnetic core, where one end of the magnetic core is positioned at least partially within the solenoidal coil L1 and where an opposite end of the magnetic core is mechanically coupled to a movable electrical contact of the second switch 23. If the movable member 16 is moved in response to the magnetic field produced by the solenoidal coil L1, the movable electrical contact of the second switch 23 may move between the closed state and the open state. The solenoidal coil L1 may work against a return spring or resilient member that biases the electrical contacts of the second switch 23 in a normally closed state.

In one embodiment, the relay 31 may represent a double-pole, single-throw relay with two sets of normally closed electrical contacts collectively associated with the first switch 12 and the second switch 23. For a double-pole single-throw relay, the poles of the first switch 12 and the second switch 23 are ganged together by the mechanical interconnection 25 such that the switches (12, 23) simultaneously have the same state (e.g., an open state or a closed state). The double-pole, single-throw relay configuration may be used, instead of a single-pole, single-throw relay or another relay configuration, to isolate the solenoidal coil L1 from the input load impedance of the electronic device 18 under test. The first switch 12 and the second switch 23 have interconnected input terminals 11, whereas the first output terminal 13 and the second output terminals 33 are configured to provide electrical isolation, at least during the open state, between the trigger 17 (e.g., L1) and any capacitive load contribution of the electronic device 18. For example, if the input load impedance of the electronic device 18 under test has a high capacitance, the high capacitance does not counteract the inductance of the solenoidal coil L1 or otherwise impede the oscillation of the relay 31. Thus, the double-pole, single throw has a solenoidal coil L1 that is isolated from the electronic device 18 under test such that the input impedance (e.g., large capacitance) of the device under test does not load down the solenoidal coil L1 to make it inoperative.

The first switch 12 is associated with the first output terminal 13. The first output terminal 13 is connected or coupled to an inductor L2. As illustrated in FIG. 1, the inductor L2 may represent an inductor as a discrete component. However, in an alternate embodiment, the inductor L2 may refer to an integral coil of the relay 31 in addition to the solenoidal coil L1. The inductor L2 stores a magnetic field that includes electromagnetic noise such as transients formed when the first switch 12 changes states. Further, the testing device 10 provides an interruption in power flow because of the alternating closed state and open state of the first switch 12. The interruption in the power flow refers to the momentary interruptions in the power flow between the energy source 15 and the electronic device 18.

The relay 31 of FIG. 1 operates in an oscillatory manner to produce the electromagnetic noise. When electrical energy is first applied to the relay 31 through the normally closed electrical contacts, the solenoidal coil L1 begins to store energy. Electrical energy is stored as a magnetic field associated with the solenoidal coil L1. Once the magnitude of the magnetic field exceeds a threshold, the interaction of the magnetic field with the magnetic core generates sufficient force to move the movable member 16 that triggers the opening of the normally closed contacts. The threshold is defined by a force sufficient to overcome a biasing force of the return spring (not shown) or another resilient member of the relay 31. The relay 31 remains in an open state only briefly because the magnetic field in the coil is dissipated by opening the electrical contacts and holding the electrical contacts open against the bias of the return spring or resilient member. When the electrical contacts are held in the open state by the magnetic energy associated with the solenoidal coil L1, the solenoidal coil L1 does not receive any additional energy from the electronic device 18 or the energy source 15. Accordingly, the electrical contacts return to the normally closed position once the energy in the solenoidal coil L1 is depleted. The foregoing sequence of opening and closure of the electrical contacts repeats itself such that the relay 31 oscillates.

The resistive arrangement 27 is used for adjusting a level of electromagnetic noise applied to the electronic device 18 under test. For example, the resistive arrangement 27 may permit the level of electromagnetic noise applied to the test device 18 to be adjusted to mimic real world conditions present in a vehicular or automotive environment. As shown in FIG. 1, the resistive arrangement 27 is coupled in parallel with the inductor L2. In an alternate embodiment, the resistive arrangement 27 may be coupled in series with the inductor L2 to control the magnitude of the electromagnetic noise.

As shown in FIG. 1, the testing device 10 may provide a direct output, a capacitively coupled output, or both. The direct output may be applied to a power supply input 19 of an electronic device. In contrast, the capacitively coupled output may be applied to a signal input 29 of the electronic device under test. The capacitively coupled output may be formed by placing capacitor C1 in series with the output terminal of the relay 31, for example. The capacitor C1 attenuates some low frequency transients in the outputted test signal to eliminate the power interruption in the test signal. The direct output outputs a power supply signal with power supply interruptions and transients as the electrical noise. The capacitively coupled output outputs a signal with transients alone as the electrical noise.

An electronic device 18 under test may be connected to a testing device in accordance with several different alternative techniques. Under a first technique, the testing device 10 is connected to an input power supply terminal 19 of the testing device 10 via the relay 31 to provide electromagnetic noise in the form of electrical transients and power interruptions to the testing device 10. Under a second technique, the testing device 10 is coupled to a signal input terminal 29 of the electronic device 18 under test to test the immunity or performance of the electronic device 18 under exposure to electrical transients. Under a third technique which is shown in FIG. 1, the testing device 10 is connected to both an input power supply terminal 19 and the signal input terminal 29 of the electronic device 18 to test the response of the electronic device 18 to electromagnetic noise.

The testing device 10 is connected to the electronic device 18 under test such that the inductor L2 is connected in parallel with the electronic device 18 under test. The electrical contacts of the relay 31 or the first switch 12 are connected in a series electrical path between the energy source 15 and the electronic device 18 under test. Because the relay 31 is an electromechanical device, each time the electrical contacts open and close, the electrical contacts create a unique combination of electrical transients and electromagnetic noise. For example, the electromagnetic noise produced by the oscillatory contact closures may represent a continuously random sequence of electromagnetic noise. The electromagnetic noise varies in spectral content and amplitude over time.

The variation in the created transients and electromagnetic noise are well suited for screening the electronic device 18 under test to determine if the electronic device 18 has an immunity concern to electromagnetic noise. In particular, the testing device 10 may facilitate the identification of faulty operation of microprocessor-based equipment or associated software code for the microprocessor-based equipment in the presence of electromagnetic noise. The varying nature (e.g., random variation) of the noise of the testing device 10 may be more useful for testing the electronic device 18 under test than conventional test equipment that merely generates repeatable electromagnetic noise in a limited, albeit adjustable frequency spectrum. Accordingly, the generally varying noise output of the testing device 10 may afford momentary alignment of the characteristics of the electromagnetic noise with a certain point in the execution of a software program such that the performance of the electronic device 18 is actually affected or disrupted, indicating the need for additional, more detailed testing or a design change in the electronic equipment.

Although a wide assortment of component values may be selected for a proper operation of the testing device 10 of FIG. 1, in one embodiment the testing device 10 may include the following exemplary values: The energy source 15 may provide an output of approximately 12 volts DC. The potentiometer R1 may have a value that ranges from approximately zero to approximately 10 kilo-ohms. Resistor R2 may have a value that is approximately 1 kilo-ohms. Capacitor C1 may have a value of approximately 10 nano-Farads.

The testing device 10 of FIG. 1 is capable of producing electrical transients and modeling the power interruptions to the electronic device 18. The energy source 15 is actually used to provide the necessary electrical power to operate the electronic device 18 for testing purposes. In other situations, the user of a testing device 10 may desire to test the electronic device 18 for performance in the presence of RFI as the electrical noise, instead of electrical transients and power interruptions. For instance, RFI may include interference from mobile telecommunication devices such as cellular phones, personal communication service (PCS) phones, or other microwave or radio frequency equipment.

Figure 2:
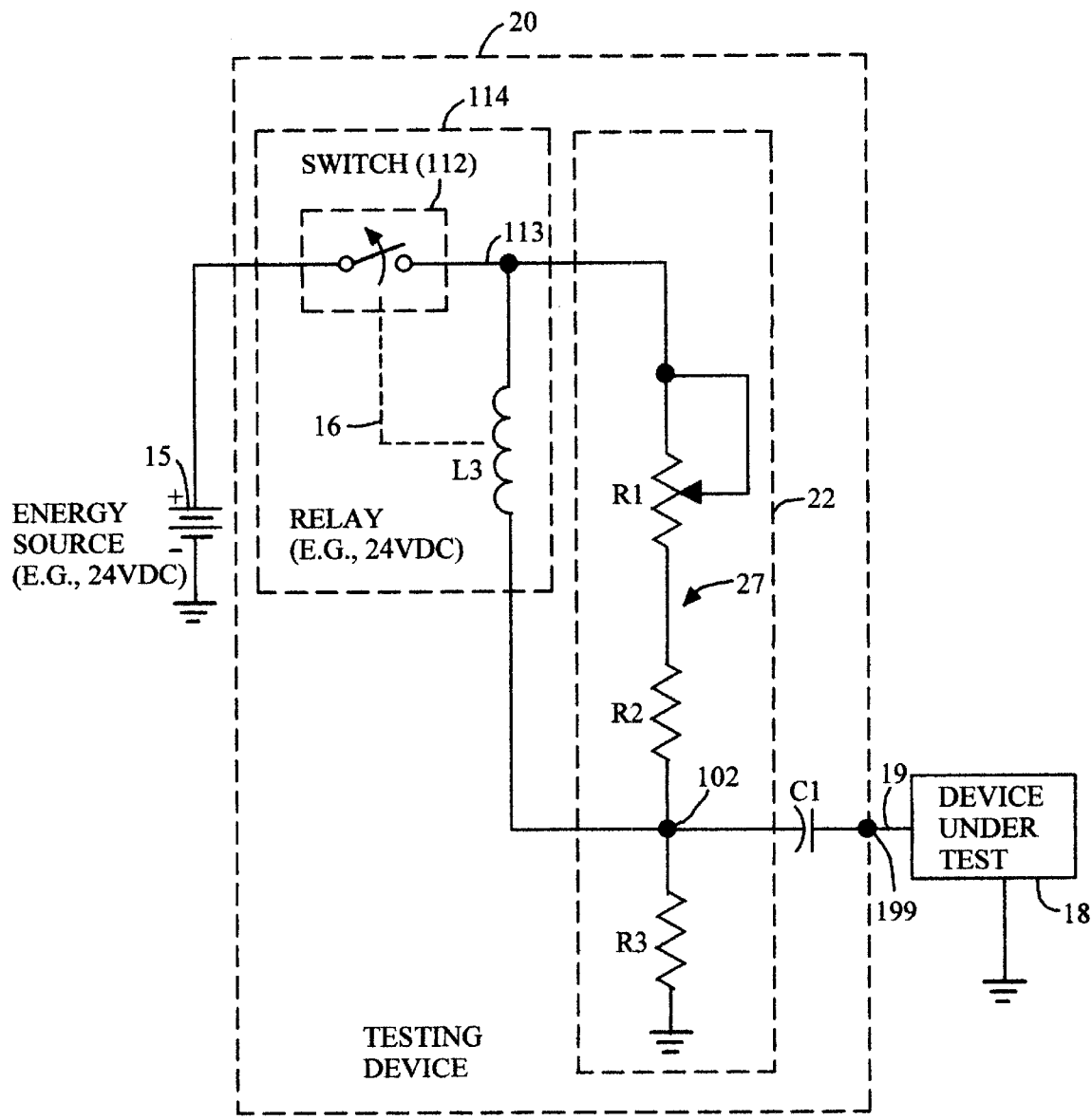
FIG. 2 is a schematic diagram of another embodiment of a testing device for testing the performance or response of an electronic device to the application of electromagnetic RFI noise in accordance with the invention.

The testing device 20 of FIG. 2 is similar to the testing device 10 of FIG. 1 except a more basic relay 114 of FIG. 2 replaces relay 31 of FIG. 1 and the testing device 20 of FIG. 2 includes a resistive network 22. Like elements in FIG. 1 and FIG. 2 are labeled with like reference numerals.

The relay 114 of FIG. 2 may comprise a single-pole, single-throw relay as opposed to a double-pole, single throw relay, which was previously disclosed for a preferred embodiment of FIG. 1. The relay 114 includes a switch 112 that is controlled by solenoidal coil L3 via movable mechanical member 16. The resistive network 22 is used to adjust the attenuation of the electromagnetic noise outputted to the electronic device 18.

In FIG. 2, the testing device 20 includes an energy source 15 coupled to a relay 114. In turn, the relay 114 is coupled to a resistive network 22 via switch output terminal 113. The resistive network 22 is coupled to an input terminal 19 of the electronic device 18 under test via a capacitor C1.

The resistive network 22 of FIG. 2 includes a potentiometer R1 coupled in series to resistor R2. Further, the resistive network 22 includes resistor R3, which provides a connection to ground for the relay contacts and solenoidal coil L3. The series combination of potentiometer R1 and resistor R2 is connected in parallel with the solenoidal coil L3 of the relay 114 to control the electromagnetic noise amplitude. Although an output node 102 of the testing device 20 is formed at the electrical connection of the solenoidal coil L3, resistor R2, resistor R3, and capacitor C1, in other embodiments, an output node may be formed by different electrical connections among the components of the testing device 20.

Potentiometer R1 of FIG. 2 allows adjustment of the resistance of the resistive network 22 and, hence, adjustment of the electromagnetic noise amplitude at the output node 102. For example, if the resistance of potentiometer R1 in FIG. 2 is decreased, the electromagnetic noise amplitude at the output node 102 would decrease. Conversely, if the resistance of potentiometer R1 is increased, the electromagnetic noise amplitude at the output node 102 would increase. If the resistive arrangement 27, including potentiometer R1, has a low resistance with reference to the reactance of the solenoidal coil L3, the noise energy stored by the solenoidal coil L3 tends to decrease as a greater proportion of energy outputted from the relay 114 bypasses the solenoidal coil L3. In contrast, if the resistive arrangement 27, including potentiometer R1, has a high resistance with reference to the reactance of the solenoidal coil L3, the solenoidal coil L3 experiences less suppression from the resistive arrangement 27 and a greater output of noise energy.

The oscillation of the relay 14 in FIG. 2 and the arcing contacts create a broad spectrum of electromagnetic noise that extends from approximately one Megahertz (MHz) to at least one Gigahertz (GHz). For example, the electromagnetic noise may extend from one MHz to above 1 GHz at a negative slope of approximately 20 dB/decade. A decade refers to a frequency change on the order of a multiple of ten. The electromagnetic noise is developed across resister R3. Resistor R3 is coupled to the input terminal 19 (e.g., 12 VDC, positive terminal) of the electronic device 18 via the series capacitor C1. After adjustment of the electromagnetic noise amplitude to a suitable level for the electronic device, the capacitor C1 allows coupling to a terminal of the electronic device 18. The value of capacitor C1 may be selected to block direct current voltage from interfering with the ordinary operation of the electronic device 18.

In one embodiment, the energy source 15 in FIG. 2 has an output voltage that provides sufficient current to coil L3 for proper relay operation while considering the resistance of R3. To facilitate the provision of the proper current for coil L3, resistor R3 is typically a fraction of the direct current resistance of solenoidal coil L3. Potentiometer R1 and resistor R2 provide a circuit for adjusting the amplitude of the electromagnetic noise produced. The resistance of the series combination of potentiometer R1 and resistor R2 is typically greater than ten times the resistance of solenoidal coil L3.

Although a wide assortment of component values may be selected for a proper operation of the testing device 20 of FIG. 2, in one embodiment the testing device 20 may include the following values: The energy source 15 may provide 12 volts DC. Solenoidal coil L3 may have a DC resistance of 100 ohms and resistor R3 may have a resistance of 10 ohms. The potentiometer R1 may have a value that ranges from approximately zero to approximately 10 kilo-ohms. Resistor R2 may have a value that is approximately 1 kilo-ohms. In one embodiment, the resistance of potentiometer R1 in series with resistor R2 greatly exceeds the resistance (i.e., reactance at direct current voltage) of solenoidal coil L3. Capacitor C1 may have a value of 10 nano-Farads or another value that suitably tailors the spectral response of the electromagnetic noise.

In another embodiment, the output electromagnetic noise amplitude can be increased by increasing the amplitude of the voltage of the energy source 15 in FIG. 2 and generally proportionally increasing the resistance of resistor R3. For the relay 114 of FIG. 2, if the current is kept approximately the same (for proper relay operation), then the increased resistance of resistor R3 allows more electromagnetic noise voltage to be developed at the output of the testing device 20.

Although a wide assortment of component values may be selected for proper operation of the testing device 20 of FIG. 2, in one illustrative embodiment the testing device 20 may use the following values for the various components: The energy source 15 may provide 24 volts DC. Solenoidal coil L3 may have a DC resistance of 100 ohms and resistor R3 may have a resistance of 140 ohms.

Figure 3:
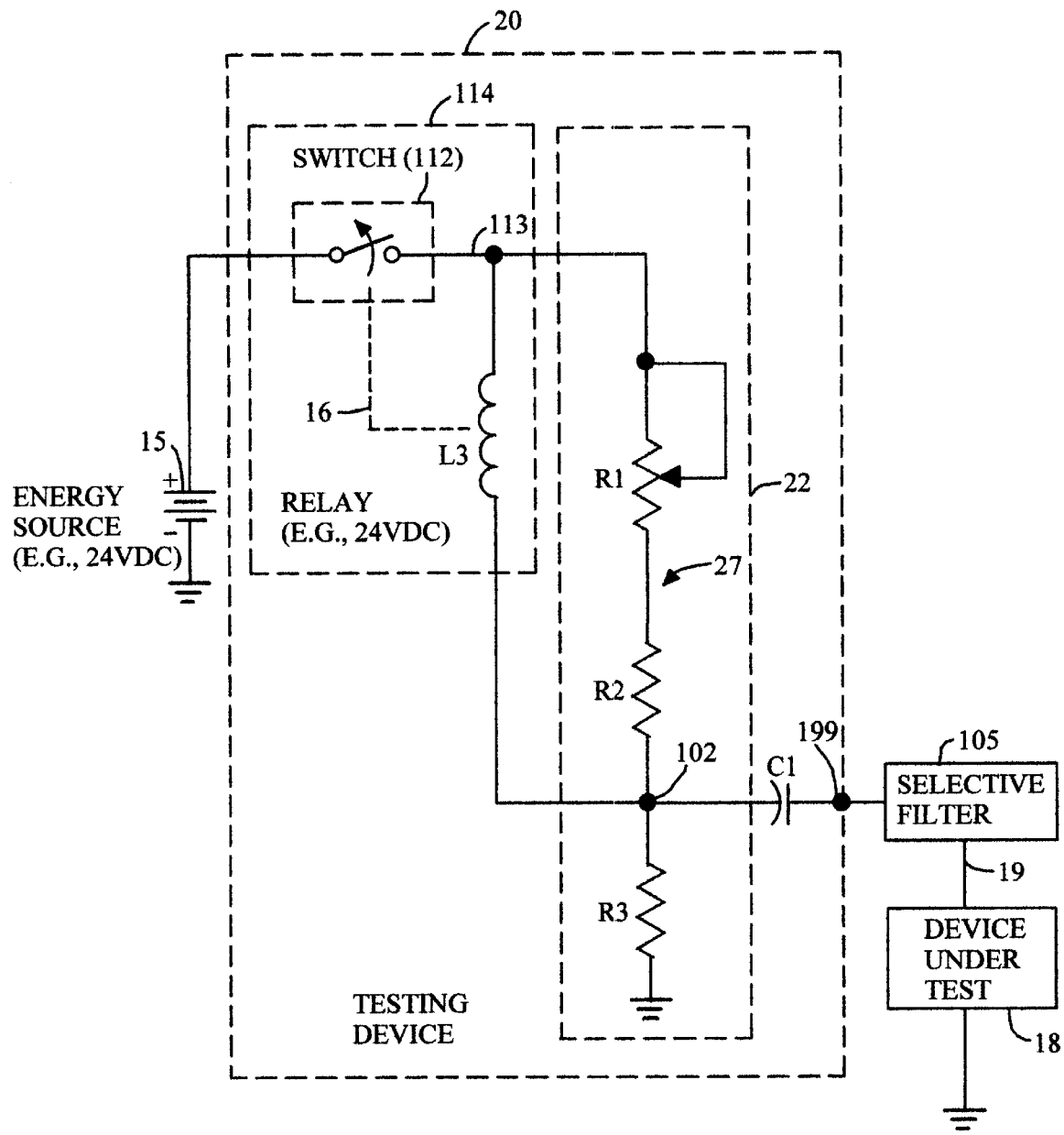
FIG. 3 is a diagram that shows the use of the testing device of FIG. 2 in conjunction with a frequency-selective filter.

Although the testing device 20 of FIG. 2 produces a broadband spectrum of electromagnetic interference, the electromagnetic spectrum may be measured with a spectrum analyzer or other equipment to further identify the electromagnetic spectrum to,which the electronic test device is exposed. As shown in FIG. 3, the designer or another person can use the testing device 20 of FIG. 2 in conjunction with a frequency-selective filter 105. The designer can optimize the electromagnetic immunity of the electronic device 18 under test by inserting the frequency-selective filters 105 or multiple filters in the transmission line (e.g., wire) between the output of the testing device and the input supply terminal as shown in FIG. 3. The selective filter 105 may have any type of suitable frequency versus magnitude response, including a reject response, a pass-band response, a pass-reject response, a notch or any combination of foregoing characteristics. Accordingly, if the frequency of the selective filter is known, the performance or noise immunity versus frequency of the electronic device may be determined. Circuit modifications or software modifications of the electronic device 18 could address the frequencies with the most deficient noise immunity.

The foregoing testing devices disclosed in FIG. 1 and FIG. 2 are particularly well suited for use as screening tools to first quickly and efficiently identify potential concerns with regards to electromagnetic noise, electromagnetic interference, transients, or any combination of the foregoing unwanted noise. The screening tools of the invention are readily applied by technicians or workers with various skill levels with little supervision. Once a design problem with respect to noise immunity is detected, other more elaborate techniques may be used to pinpoint or identify specific problems with the design of the electronic device 18 under test.

The foregoing testing devices may facilitate identifying design concerns or glitches concerning electromagnetic interference before the deficient electronic devices are produced. The testing device may lead to reduced warranty costs and increased customer satisfaction as the quality of shipped products is effectively screened. Design problems are readily resolved before the customer is aware of any problem in the performance of the electronic device because of deficient immunity to electromagnetic noise or electromagnetic interference. Moreover, the testing device (10 or 20) of FIG. 1 and FIG. 2 are readily implemented outside of a test lab environment using inexpensive components and non-expert staff.

Figure 4:
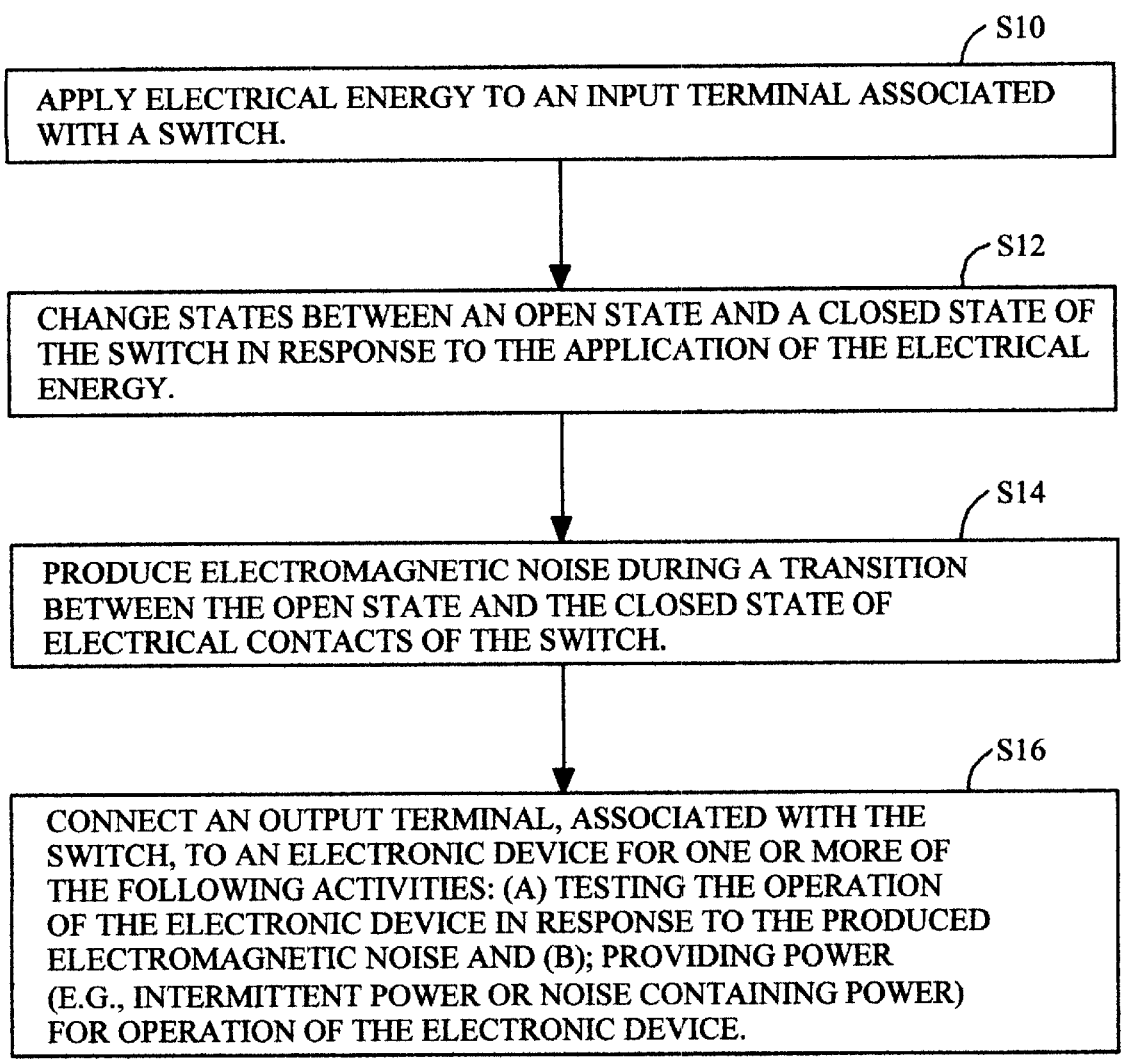
FIG. 4 is a flow chart of a method for generating electromagnetic noise for application to an electronic device in accordance with the invention.

FIG. 4 is a flow chart of a method for generating electromagnetic noise for application to an electronic device 18 in accordance with the invention. The method of FIG. 4 starts in step S10.

In step S10, an energy source 15 applies electrical energy to an input terminal associated with a switch (12 or 112) of a testing device (10 or 20). In one embodiment, the switch (12 or 112) comprises a normally closed relay. Electrical energy is applied to a solenoidal coil (L1 or L3) of the normally-closed rely.

In step S12, the switch (12 or 112) of the testing device (10 or 20) changes states between a closed state and an open state of the switch (12 or 112) in response to the application of the electrical energy.

In step S14, the switch (12 or 112) of the testing device (10 or 20) produces electromagnetic noise during a transition between the closed state and the open state of electrical contacts of the switch (12 or 112). The production of electromagnetic noise is facilitated by the interaction of the electrical contacts with an inductive load connected to an output of the switch (12 or 112). The inductive load may be provided by a solenoidal coil (L3) associated with the switch (112), by a discrete inductor (L2), or by another suitable coil. For example, in one embodiment an inductor L2 is coupled between a switch output terminal of the switch (12) and ground to facilitate production of the electromagnetic noise transient during transitions of the electrical contacts.

In step S16, an output terminal (99 or 199), which is associated with the switch (12 or 112), is connected to the electronic device 18 for conducting one or more of the following activities: (a) testing operation of the electronic device 18 in response to the produced electromagnetic noise and (b) providing power for operation of the electronic device 18. The electrical power provided may be intermittent electrical power, generally continuous electrical power with a transient component, or electrical power with a noise component. For example, the produced electromagnetic noise of step S14 and electrical power from energy source 15 may represent signal components of a power supply signal that provides electrical energy for operating the electronic device 18. Further, performance of the electronic device 18 may be monitored during the application of the power supply signal. In one embodiment, a series output capacitor C1 is coupled between the output terminal (99 or 199) and the electronic device 18 to block direct current from flowing into the electronic device 18 to facilitate testing via a terminal other than a power supply terminal of the electrical device 18.

The method of FIG. 4 may be supplemented by further tests by tailoring or tuning the electromagnetic noise for application to the electronic device 18. In one example, the testing device (10 or 20) or a resistive member (e.g., resistive network 22 or a resistive arrangement 27) adjusts the magnitude of the electromagnetic noise to have a realistic magnitude of an electrical transient associated with an electrical system of a vehicle. In another example, the electromagnetic noise is filtered to have a realistic frequency spectrum of an electrical transient associated with an electrical system of a vehicle. The realistic magnitude and realistic frequency spectrum may be determined by empirical measurements or statistical analysis of a test group of vehicles. For instance, the realistic magnitude and realistic frequency spectrum may represent a mean or average magnitude and frequency response, respectively, of the test group of vehicles.

The foregoing description of the testing device and method describes several illustrative samples of the invention. Modifications, alternative arrangements, and variations of the illustrative examples are possible and may fall within the scope of the invention. Accordingly, the following claims should be accorded the reasonably broadest interpretation, which is consistent with the specification disclosed herein and not unduly limited by aspects of the preferred embodiments disclosed herein.

The following is claimed:

1. A testing device for generating electromagnetic noise for application to an electronic device, the testing device comprising:
   a switch comprising electrical contacts for producing electromagnetic noise during a transition between a closed state and an open state of the electrical contacts;
   a trigger for changing states between the closed state and the open state, the trigger coupled to the switch;
   an input terminal associated with the switch for applying electrical energy to the switch; and
   an output terminal supporting transmission of electromagnetic noise from the switch to the electronic device, the output terminal electrically connected to the electronic device for testing operation of the electronic device in response to the electromagnetic noise.

2. The testing device according to claim 1 wherein the switch and the trigger collectively comprise a normally-closed relay having an open state with no electrical energy applied to a power supply terminal of the electronic device.

3. The testing device according to claim 2 wherein the trigger comprises a solenoidal coil of the normally closed relay.

4. The testing device according to claim 1 wherein the trigger comprises a solenoidal coil, and wherein when the solenoidal coil stores a sufficient magnetic field to place the switch into the open state, the switch having the open state until the solenoid coil is discharged.

5. The testing device according to claim 1 wherein the input terminal is coupled to an energy source to provide electrical energy and wherein the electromagnetic noise has a varying spectral output for realistically modeling an electrical transient associated with an electrical system of a vehicle.

6. The testing device according to claim 1 wherein a resistive network provides resistance in a signal path between a switch output terminal of the switch and the output terminal; and the resistive network comprising an output resistor shunted to ground.

7. The testing device according to claim 6 wherein the resistive network interacts with a solenoidal inductor to simulate radio frequency interference as the electromagnetic noise.

8. The testing device according to claim 1 further comprising a series capacitor coupled in a signal path between the switch and the output terminal to block direct current from flowing into the electronic device.

9. The testing device according to claim 1 wherein the switch and the trigger collectively represent a double-pole, single-throw relay having the electrical contacts in a normally closed state.

10. The testing device according to claim 9 wherein the double-pole, single-throw relay comprises the switch and a second switch with interconnected switch input terminals and switch output terminals configured to provide isolation, at least during the open state, between the trigger and a capacitive load contribution of the electronic device.

11. The testing device according to claim 1 further comprising:
   an inductor coupled between a switch output of the switch and ground to provide an electromagnetic noise transient during the transition of the electrical contacts between the closed state and an open state.

12. The testing device according to claim 11 further comprising:
a resistive arrangement coupled in parallel to the inductor for adjusting a magnitude of the electromagnetic noise transient.

13. The testing device according to claim 1 further comprising a frequency selective filter coupled to the output terminal for modifying a spectral response of the electromagnetic noise transient applied to the electronic device.

14. The testing device according to claim 1, wherein said electromagnetic noise has a varying spectral content.

15. The testing device according to claim 14, wherein said electromagnetic noise has a continuously random sequence.

16. The testing device according to claim 1, wherein said electromagnetic noise has a continuously random sequence.

17. A method for generating electromagnetic noise for application to an electronic device, the method comprising:
applying electrical energy to an input terminal associated with a switch;
changing states between a closed state and an open state of the switch in response to the application of the electrical energy;
producing electromagnetic noise during a transition between the closed state and the open state of electrical contacts of the switch; and
connecting an output terminal associated with the switch to the electronic device for at least one of the following: (a) testing operation of the electronic device in response to the produced electromagnetic noise and (b) providing electrical power for operation of the electronic device.

18. The method according to claim 17 wherein the changing states comprises changing states of a normally-closed relay as the switch.

19. The method according to claim 18 wherein the applying electrical energy comprises applying electrical energy to a solenoidal coil of the normally-closed relay.

20. The method according to claim 17 wherein the producing electrical noise comprises coupling an inductor between a switch output terminal of the switch and ground to provide the electromagnetic noise transient during transitions of the electrical contacts.

21. The method according to claim 17 further comprising adjusting a magnitude of the electromagnetic noise to have a realistic magnitude of an electrical transient associated with an electrical system of a vehicle.

22. The method according to claim 17 further comprising the step of filtering the electromagnetic noise to have a realistic frequency spectrum of an electrical transient associated with an electrical system of a vehicle.

23. The method according to claim 17 further comprising coupling a series output capacitor between the output terminal and the electronic device to block direct current from flowing into the electronic device to facilitate testing via a terminal other than a power supply terminal of the electrical device.

24. The method according to claim 17, wherein said electromagnetic noise has a varying spectral content.

25. The method according to claim 24, wherein said electromagnetic noise has a continuously random sequence.

26. The method according to claim 17, wherein said electromagnetic noise has a continuously random sequence.

27. A method of testing an electronic device for immunity to electromagnetic noise, the method comprising:
applying electrical energy to an input terminal associated with a switch;
changing states between a closed state and an open state of the switch in response to the application of the electrical energy;
producing electromagnetic noise during a transition between the closed state and the open state of electrical contacts of the switch; and
monitoring performance of the electronic device in response to the produced electromagnetic noise while providing electrical power for operation of the electronic device, the electrical power and electromagnetic noise representing signal components of a power supply signal.

28. The method according to claim 27 wherein the changing states comprises changing states of a normally-closed relay as the switch.

29. The method according to claim 28 wherein the applying electrical energy comprises applying electrical energy to a solenoidal coil of the normally-closed relay.

30. The method according to claim 27 wherein the producing electrical noise comprises coupling an inductor between a switch output terminal of the switch and ground to provide the electromagnetic noise transient during transitions of the electrical contacts.

31. The method according to claim 27, wherein said electromagnetic noise has a varying spectral content.

32. The method according to claim 31, wherein said electromagnetic noise has a continuously random sequence.

33. The method according to claim 27, wherein said electromagnetic noise has a continuously random sequence.

* * * * *